US006841985B1

United States Patent
Fetzer

(10) Patent No.: US 6,841,985 B1
(45) Date of Patent: Jan. 11, 2005

(54) METHOD AND CIRCUIT FOR MEASURING ON-CHIP, CYCLE-TO-CYCLE CLOCK JITTER

(75) Inventor: Eric S. Fetzer, Longmont, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 6 days.

(21) Appl. No.: 10/630,175

(22) Filed: Jul. 29, 2003

(51) Int. Cl.[7] .............................................. G01R 23/12
(52) U.S. Cl. ................... 324/76.53; 324/76.52
(58) Field of Search ......................... 324/76.35, 76.52, 324/76.53, 76.74, 613, 622; 702/69

(56) References Cited

U.S. PATENT DOCUMENTS

| | | | | |
|---|---|---|---|---|
| 6,185,510 B1 | * | 2/2001 | Inoue | 702/69 |
| 6,542,038 B2 | * | 4/2003 | Nishimura et al. | 331/1 A |
| 6,640,193 B2 | * | 10/2003 | Kuyel | 702/69 |
| 6,661,266 B1 | * | 12/2003 | Variyam et al. | 327/159 |
| 6,754,613 B2 | * | 6/2004 | Tabatabaei et al. | 702/189 |
| 2004/0061488 A1 | * | 4/2004 | Rosenbaum et al. | 324/76.53 |

* cited by examiner

Primary Examiner—N. Le
Assistant Examiner—Walter Benson
(74) Attorney, Agent, or Firm—John R. Pessetto

(57) ABSTRACT

The invention provides a method and circuit for measuring on-chip, cycle-to-cycle, jitter. Copies of a circuit comprising a programmable delay line, a programmable phase comparator, and two counters are placed at different locations on an IC near a clock signal. The programmable delay line creates a clock signal that is delayed by one clock cycle. This delayed clock signal is compared in time to the original clock signal by the programmable phase comparator. If the difference in time between the delayed clock signal and the clock signal is greater than the dead time, the first counter is triggered. If the difference in time is negative and the absolute value is greater than the dead time, the second counter is triggered. A statistical distribution, based on the values of the counters, is created. This distribution is used to predict on-chip, cycle-to-cycle jitter.

19 Claims, 5 Drawing Sheets

METHOD AND CIRCUIT FOR MEASURING ON-CHIP, CYCLE-TO-CYCLE CLOCK JITTER

FIELD OF THE INVENTION

This invention relates generally to clocking circuits on integrated electronic circuits. More particularly, this invention relates to measuring on-chip, cycle-to-cycle clock jitter.

BACKGROUND OF THE INVENTION

A microprocessor used in many large computer systems may include memory elements, combinational logic, and a clocking system. The memory elements may be arranged in sets, sometimes called registers that may correspond to the word size used in a computer system. Between at least some sets of memory elements are combinational logic circuits. At the end of a clock cycle, which is also the beginning of the next clock cycle, data on the output of the combinational logic circuitry is stored in a first set of memory elements. This data appears on the output of the set of memory elements, and therefore on the input of other combinational logic circuitry. The other logic circuitry performs the designed logic function on the data, and at the end of the clock cycle the output of this combinational logic is stored in a next set of memory elements. This process is repeated as the computer operates. In other words, data is processed by combinational logic circuitry, stored in memory elements, and then passed on to other combinational logic circuitry. A system clock, often a PLL (Phase Locked Loop) controls the clocking of information from one state to the next state.

On many microprocessors a high frequency clock signal is distributed across an entire die. As clock speeds exceed 2 GHz and die size exceeds 400 square millimeters, clock distribution may become more difficult. An ideal PLL aligns the phase (edge time) of a clock signal arriving at a memory element to the system clock. However, this usually does not happen in practice. Long term jitter or variation of the phase alignment increases as the size of a die increases. As a result, the time allowed to propagate data from one memory element, through combinational logic, into another memory element is reduced. This time is often called a "clock budget."

In addition to long term jitter, a PLL may produce cycle-to-cycle jitter. Cycle-to-cycle jitter is a measure of the variation in the clock cycle due to the PLL. Cycle-to cycle jitter may occur, among other things, due to temperature variation or changes in on-chip voltages. In order to reduce the probability of system errors, the clock budget should be reduced in order to compensate for cycle-to-cycle jitter.

Measuring the jitter performance of microprocessors can be a difficult testing challenge. The cost of external equipment and testing time can be expensive. In addition, the process of probing a die in order to measure jitter usually destroys a die. Because a die is usually destroyed after one probing, additional jitter measurements at different locations on a die are usually not possible. There is a need in the art to reduce the cost of measuring jitter, reduce the number of die that are destroyed by probing, and make more than one jitter measurement on an individual die.

An embodiment of this invention allows for on-die measurement of cycle-to-cycle jitter at multiple locations through out the clock distribution. These measurements can be made without probing the die thus reducing the number of die destroyed and reducing the cost of measuring jitter.

SUMMARY OF THE INVENTION

In a preferred embodiment, the invention provides a method and circuit for measuring on-chip, cycle-to-cycle, jitter. Several copies of a circuit comprising a programmable delay line, a programmable phase comparator, and two counters are placed at different locations on an IC near a clock signal. The programmable delay line creates a clock signal that is delayed by one clock cycle. This delayed clock signal is compared in time to the clock signal by the programmable phase comparator. If the difference in time between the delayed clock signal and the clock signal is greater than the dead time programmed in the programmable phase comparator, the first counter is triggered. If the difference in time is negative and the absolute value is greater than the dead time, the second counter is triggered. A statistical distribution, based on the values of the counters, is created. This distribution is used to predict on-chip, cycle-to-cycle jitter.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
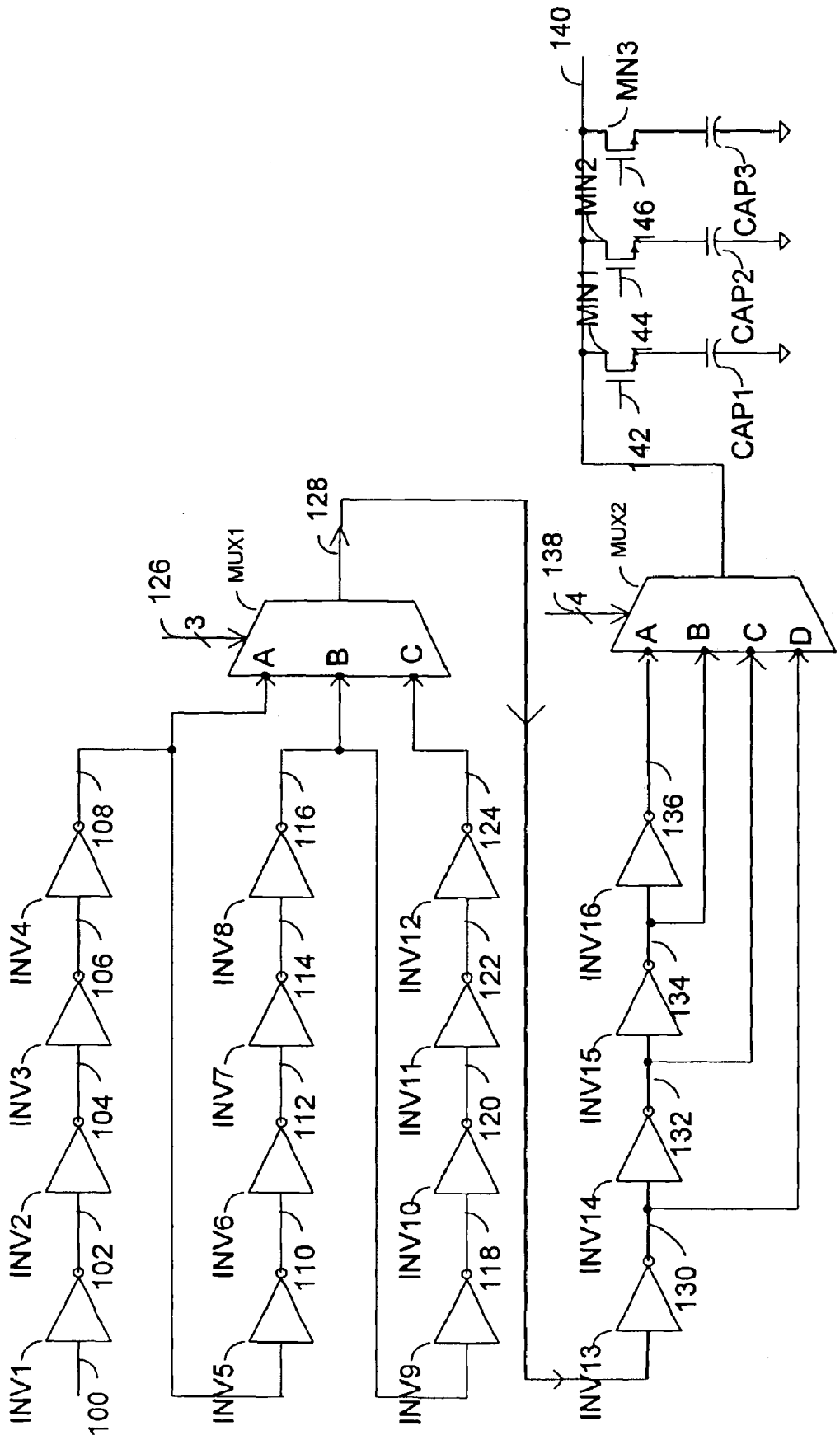
FIG. 1 is a schematic drawing of a programmable delay line.

FIG. 1 is a schematic drawing of a programmable delay line. The input, 100, to the programmable delay line is connected to the input of inverter INV1. The output, 102, of inverter INV1 is connected to the input, 102, of inverter INV2. The output, 104, of inverter INV2 is connected to the input, 104, of inverter INV3. The output, 106, of inverter INV3 is connected to the input, 106, of inverter INV4. The output, 108, of inverter INV4 is connected to the input, 106, of inverter INV5 and input A of MUX1. The output, 110, of inverter INV5 is connected to the input, 110, of inverter INV6. The output, 112, of inverter INV6 is connected to the input, 112, of inverter INV7. The output, 114, of inverter INV7 is connected to the input, 114, of inverter INV8. The output, 116, of inverter INV8 is connected to the input, 116, of inverter INV9 and input B of MUX1. The output, 118, of inverter INV9 is connected to the input, 118, of inverter INV10. The output, 120, of inverter INV10 is connected to the input, 120, of inverter INV11. The output, 122, of inverter INV11 is connected to the input, 122, of inverter INV12. The output, 124, of inverter INV12 is connected to input C of MUX1. Control input, 126, selects either input A, B, or C of MUX1.

The output, 128, of multiplexer MUX1 is connected to the input, 128, of inverter INV13. The output, 130, of inverter INV13 is connected to the input, 130, of inverter INV14 and the input, D, of multiplexer, MUX2. The output, 132, of inverter INVI4 is connected to the input, 132, of inverter INV15 and the input, C, of multiplexer, MUX2. The output, 134, of inverter INV15 is connected to the input, 134, of inverter INV16 and the input, B, of multiplexer, MUX2. The output, 136, of inverter INV16 is connected to the input, A, of multiplexer, MUX2. The output of the programmable delay line is the output, 140, of the multiplexer, MUX2. Control input, 138, selects either input A, B, C, or D of MUX2.

The output, 140, of the multiplexer, MUX2, is connected to drains of NFETs, MN1, MN2, and MN3. Control input, 142, is connected to the gate of MN1. Control input, 144, is connected to the gate of MN2. Control input, 146, is connected to the gate of MN3. The source of NFET, MN1 is connected to a node of capacitor, CAP1. The other node of capacitor, CAP1, is connected to GND. The source of NFET, MN2 is connected to a node of capacitor, CAP2. The other node of capacitor, CAP2, is connected to GND. The source of NFET, MN3 is connected to a node of capacitor, CAP3. The other node of capacitor, CAP3, is connected to GND.

A course adjustment of the programmable delay shown in FIG. 1 may be achieved by either selecting input A, B, or C of multiplexer, MUX1. A delay of four inverters may be achieved by selecting input A. A delay of eight inverters may be achieved by selecting input B. A delay of twelve inverters may be achieved by selecting input C.

A fine adjustment of the programmable delay shown in FIG. 1 may be achieved by either selecting input A, B, C, or D of multiplexer, MUX2. A delay of four inverters may be achieved by selecting input A. A delay of three inverters may be achieved by selecting input B. A delay of two inverters may be achieved by selecting input C. A delay of one inverter may be achieved by selecting input D.

The values of capacitors, CAP1, CAP2, and CAP3 are selected to be binary values of each other. For example, if the value of CAP1 is 1 pF, CAP2 could be 2 pF and CAP3 could 4 pF. In this way, by selecting specific combinations of control signals 142, 144, and 146, the available load values on node 140 are 1 pF, 2 pF, 3 pF, 4 pF, 5 pF, 6 pF, and 7 pF. By varying the load on node 140, the delay of the programmable delay line may be adjusted with a resolution finer than the resolution required to measure on-chip, cycle-to-cycle jitter.

By using different combinations of control inputs 126, 128, 142, 144, and 146 the delay through the programmable delay line shown in FIG. 1 may be adjusted as needed. FIG. 1 is only an embodiment of a programmable delay line.

Figure 2:
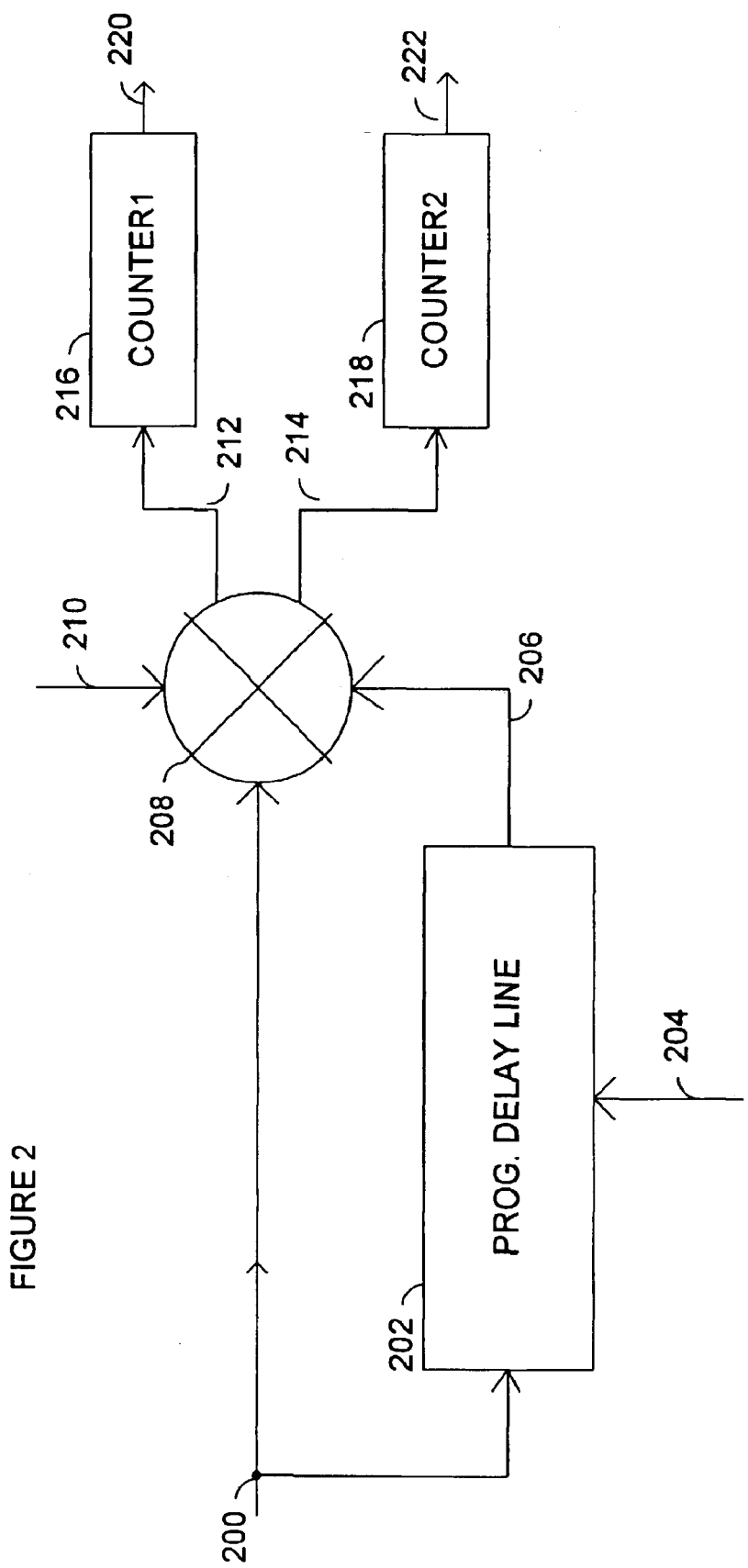
FIG. 2 is a block diagram of a circuit for measuring jitter.

FIG. 2 is a block diagram of a circuit for measuring on-chip, cycle-to-cycle jitter. A clock signal, 200 is connected to the input of the programmable delay line, 202, and to an input, of the programmable phase comparator, 208. The delay in the programmable phase comparator is adjusted by control signals, 204, such that the clock signal, 200 is delayed one clock cycle. The delayed clock signal, 206 is connected to an input of the programmable phase comparator, 208.

The programmable phase comparator, 208, compares the period of clock signal, 200, to the period of the delayed clock signal, 206. If the time difference between the period of the clock signal, 200 and the period of the delayed clock signal, 206 is within the programmed "dead zone" of the programmable phase comparator, 208, no counter is triggered. The dead zone is a specific time period that is programmed by control signal 210.

If the difference between the period of the clock signal, 200 and the period of the delayed clock, 206 is greater than the time determined by the dead zone, an output, 212, from the programmable phase comparator, 208, triggers counter1, 216. If the difference between the period of the clock signal, 200, and the period of the delayed clock, 206, is negative and its absolute value is greater than the time determined by the dead zone, an output, 214, from the programmable phase comparator, 208, triggers counter2, 218. By setting the dead zone to different values and rerunning the measurement multiple times, a statistical distribution of clock cycle variation may be extracted from the data output, 220, from counter1, 216, and from the data output, 222, from counter2, 218.

Figure 3:
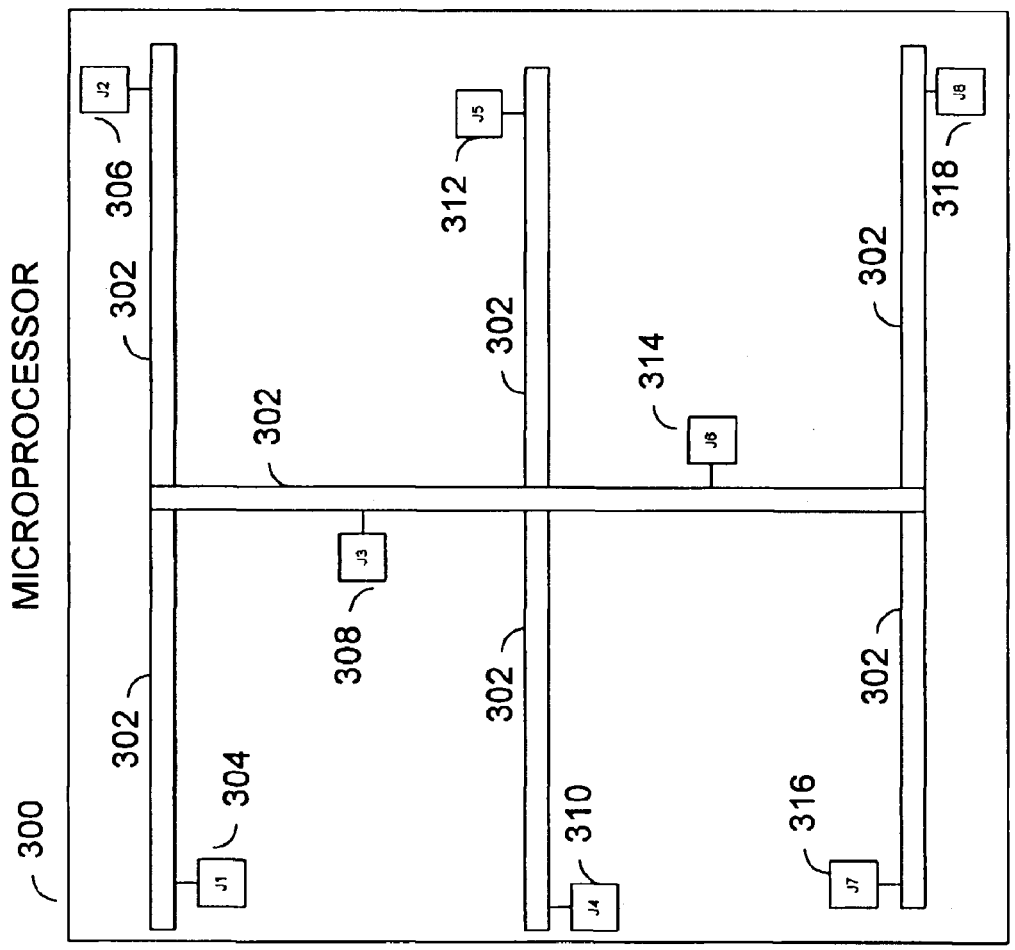
FIG. 3 is a drawing illustrating how individual jitter measuring circuits may be placed at different locations on an integrated circuit.

FIG. 3 is a drawing illustrating how individual jitter measuring circuits may be placed at different locations on a microprocessor. An example of a clock distribution, 302, is shown on a microprocessor, 300. Cycle-to-cycle jitter measurement circuits, J1, 304, J2, 306, J3, 308, J4, 310, J5, 312, J6, 314, J7, 316, and J8, 318 are placed at various locations on the microprocessor. By placing these circuits at these locations, cycle-to-cycle jitter may be more accurately measured. The jitter measuring circuits are not drawn to scale. FIG. 3 is only an illustration.

Figure 4:
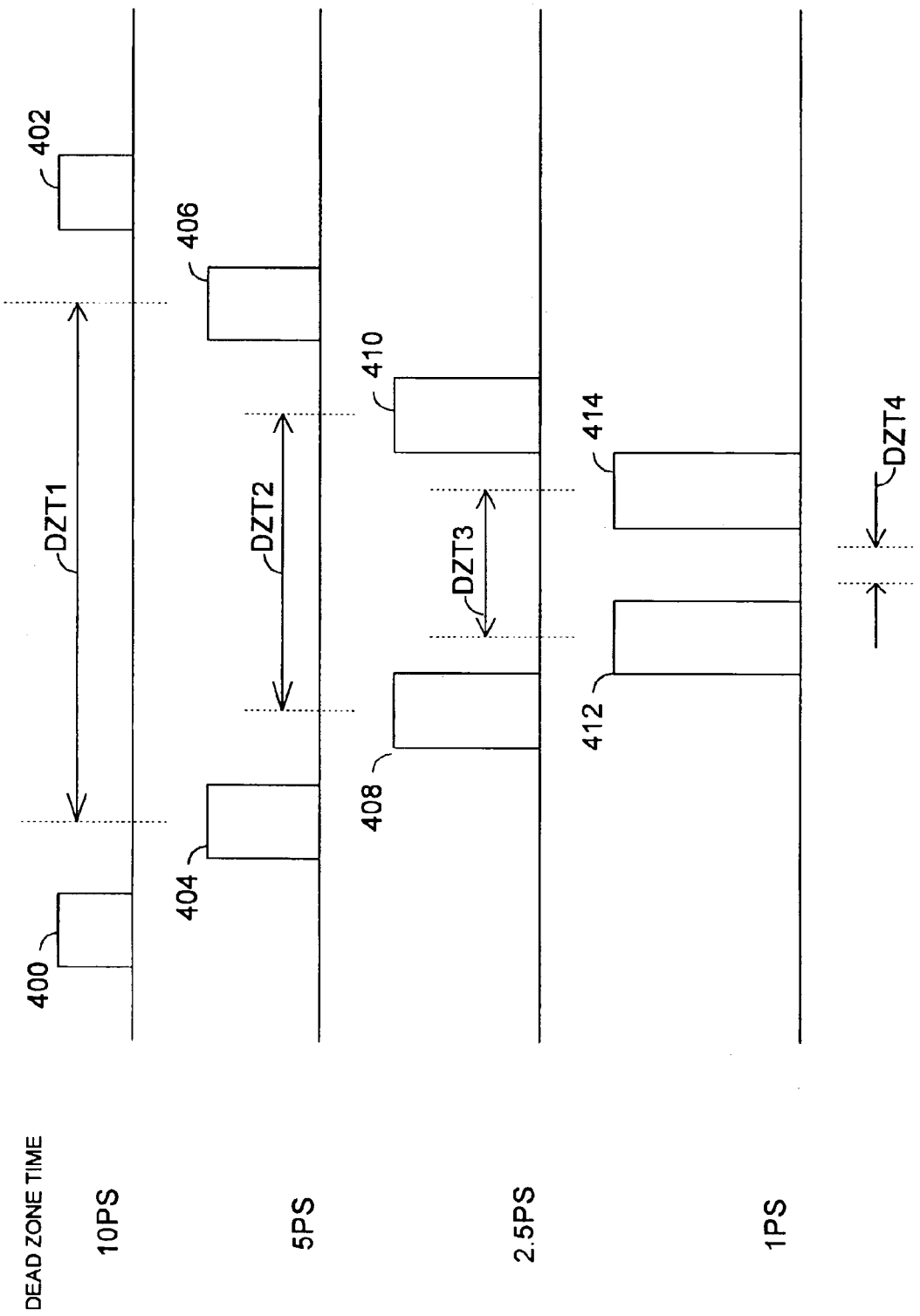
FIG. 4 is a drawing showing distributions outside the dead zone at various programmed values of the dead zone.

FIG. 4 is a drawing showing distributions of on-chip cycle-to-cycle jitter outside the dead zone at various programmed values of the dead zone. For example, with a the dead zone programmed for 10 ps, a certain number of samples, 400, fall above the dead zone, DZT1, and a certain number of samples, 402, fall below the dead zone, DZT1. By reducing the dead zone time to 5 ps, more samples fall outside the dead zone, DZT2 than when the dead zone was programmed for 10 ps, DZT1. A certain number of samples, 404, fall above the dead zone, DZT2, and a certain number of samples, 406, fall below the dead zone, DZT2.

By reducing the dead zone time to 2.5 ps, more samples fall outside the dead zone, DZT3 than when the dead zone was programmed for 5 ps, DZT2. A certain number of samples, 408, fall above the dead zone, DZT3, and a certain number of samples, 410, fall below the dead zone, DZT3. By reducing the dead zone time to 1 ps, more samples fall outside the dead zone, DZT4 than when the dead zone was programmed for 2.5 ps, DZT3. A certain number of samples, 412, fall above the dead zone, DZT4, and a certain number of samples, 414, fall below the dead zone, DZT4.

Figure 5:
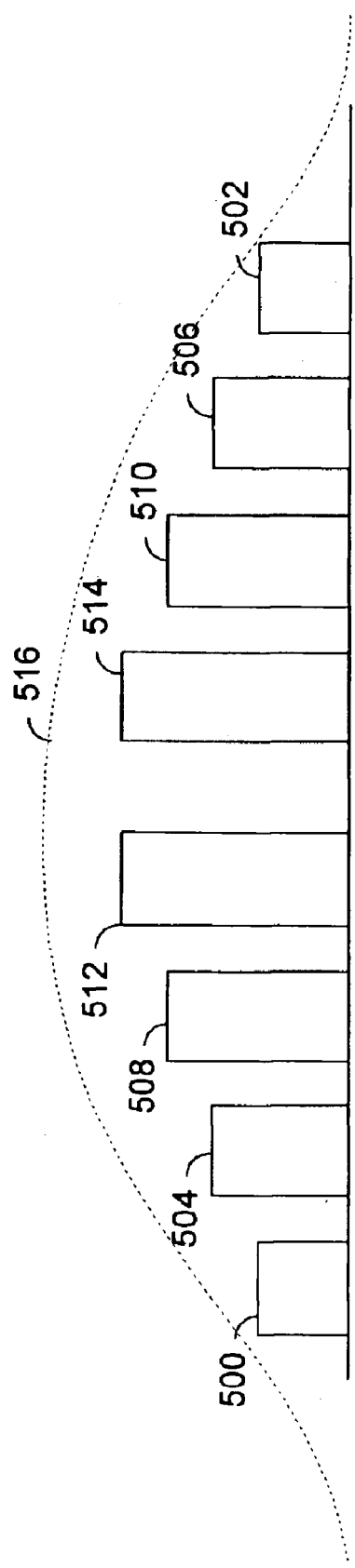
FIG. 5 is a statistical distribution illustrating how jitter measurement made on-chip may be used to predict cycle-to-cycle jitter.

FIG. 5 is a statistical distribution illustrating how jitter measurement made on-chip may be used to predict cycle-to-cycle jitter. The data obtained in FIG. 4 by measuring on-chip jitter many times is used in FIG. 5 to determine a statistical distribution.

Distribution 500 and 502 represent the number of samples, 400 and 402, respectively, measured when the dead zone, DZT1, is programmed for 10 ps. Distribution 504 and 506 represent the number of samples, 404 and 406, respectively, measured when the dead zone, DZT2, is programmed for 5 ps. Distribution 508 and 510 represent the number of samples, 408 and 410, respectively, measured when the dead zone, DZT3, is programmed for 2.5 ps. Distribution 512 and 514 represent the number of samples, 412 and 414, respectively, measured when the dead zone, DZT4, is programmed for ips.

The distribution, 516, represented by samples 500, 504, 508, 512, 514, 510, 506, and 502 may be considered a gaussian distribution. When a distribution, 516, is gaussian, the percentage of on-chip cycle-to-cycle jitter falling outside a mean on-chip, cycle-to-cycle jitter may be regularly predicted. Knowing these percentages allows a microprocessor designer to plan clock budgets as well as make changes in clocks and clock distributions for future designs.

The foregoing description of the present invention has been presented for purposes of illustration and description.

It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit for measuring on-chip cycle-to-cycle jitter comprising:
    a) a programmable delay line with an input, an output, and control inputs;
    b) a programmable phase comparator with a first input, a second input, a programming input, a first output, and a second output;
    c) a first counter with an input and an output;
    d) a second counter with an input and an output;
    e) wherein a clock signal is connected to the input of the programmable delay line and to the first input of the programmable phase comparator;
    f) wherein the delayed clock signal of the programmable delay line is connected to the second input of the programmable phase comparator;
    g) wherein the first output of the programmable phase comparator is connected to the input of the first counter;
    h) wherein the second output of the programmable phase comparator is connected to the input of the second counter;
    i) such that the first counter counts the number of times the time difference between the period of the clock signal and the period of delayed clock signal is a positive value larger than a dead zone value programmed by the programmable phase comparator;
    j) such that the second counter counts the number of times the time difference between the period of the clock signal and the period of the delayed clock signal is a negative value whose absolute value is larger than a dead zone value programmed by the programmable phase comparator.

2. A circuit as in claim 1 wherein the programmable delay line comprises:
    a) an inverter chain with an input and output;
    b) a multiplexer with multiple inputs, control inputs, and an output;
    c) wherein each input of the multiple inputs of the multiplexer is connected to a separate individual node of the inverter chain;
    d) wherein the input of the inverter chain is the input of the programmable delay line;
    e) wherein the output of the multiplexer is the output of the programmable delay line;
    f) such that the delay of the programmable delay line may be fine tuned by selecting one of the multiple inputs of the multiplexer using the control inputs of the multiplexer.

3. A circuit as in claim 1 wherein the programmable delay line comprises:
    a) a first inverter chain with an input and output;
    b) a second inverter chain with an input and output;
    c) a first multiplexer with multiple inputs, control inputs, and an output;
    d) a second multiplexer with multiple inputs, control inputs, and an output;
    e) wherein each input of the multiple inputs of the first multiplexer is connected to a separate individual node of the first inverter chain;
    f) wherein each input of the multiple inputs of the second multiplexer is connected to a separate individual node of the second inverter chain;
    g) wherein the input of the first inverter chain is the input of the programmable delay line;
    h) wherein the output of the second multiplexer is the output of the programmable delay line;
    i) wherein the output of the first multiplexer is connected to the input of the second inverter chain;
    j) such that the delay of the programmable delay line may be fine tuned by selecting one of the multiple inputs of the first multiplexer and second multiplexer using the control inputs of the first multiplexer and second multiplexer.

4. A circuit as in claim 3 wherein the time delay through any individual inverter in the first inverter chain is shorter than the time delay through any individual inverter in the second inverter chain.

5. A circuit as in claim 3 wherein the time delay through any individual inverter in the first inverter chain is longer than the time delay through any individual inverter in the second inverter chain.

6. A circuit as in claim 1 wherein the programmable delay line comprises:
    a) a first inverter chain with an input and output;
    b) a second inverter chain with an input and output;
    c) a first multiplexer with multiple inputs, control inputs, and an output;
    d) a second multiplexer with multiple inputs, control inputs, and an output;
    e) a set of NFETs;
    f) a set of capacitors;
    g) a set of control signals;
    h) wherein each input of the multiple inputs of the first multiplexer is connected to a separate individual node of the first inverter chain;
    i) wherein each input of the multiple inputs of the second multiplexer is connected to a separate individual node of the second inverter chain;
    j) wherein the input of the first inverter chain is the input of the programmable delay line;
    k) wherein the output of the second multiplexer is the output of the programmable delay line;
    l) wherein the output of the first multiplexer is connected to the input of the second inverter chain;
    m) wherein the drain of each NFET in the set of NFETs is connected to the output of the programmable delay line;
    n) where in the gate of each NFET in the set of NETs is connected to an individual control signal in the set of control signals;
    o) where in the source of each NFET in the set of NETs is connected to an individual first connection of each capacitor in the set of capacitors;
    p) where in each second connection to each capacitor in the set of capacitors is connected to ground;

q) such that the delay of the programmable delay line may be fine tuned by selecting one of the multiple inputs of the first multiplexer using the control inputs of the first multiplexer and;

r) the delay of the programmable delay line may be fine tuned by selecting one of the multiple inputs of the second multiplexer using the control inputs of the second multiplexer and;

s) the delay of the programmable delay line may be fine tuned by selecting an appropriate number of capacitors from the set of capacitors using an appropriate combination of the control signals from the set of control signals connected to the set of NFETs.

7. A circuit as in claim 6 wherein the time delay through any individual inverter in the first inverter chain is shorter than the time delay through any individual inverter in the second inverter chain.

8. A circuit as in claim 6 wherein the time delay through any individual inverter in the first inverter chain is longer than the time delay through any individual inverter in the second inverter chain.

9. A circuit as in claim 6 wherein the resolution of the fine-tuning achieved by selecting the appropriate control signals is smaller than the resolution needed to measure on-chip, cycle-to-cycle jitter.

10. A circuit as in claim 1 wherein the time difference between the period of the clock signal and the period of the delayed clock signal is measured from the positive-going zero-crossing of the clock signal to the positive-going zero-crossing of the delayed clock signal.

11. A method for measuring cycle-to-cycle jitter on chip comprising:

a) fabricating a programmable delay line;

b) fabricating a programmable phase comparator;

c) fabricating a first counter;

d) fabricating a second counter;

e) connecting a clock signal to an input of the programmable delay line and to a first input of the programmable phase comparator;

f) connecting a delayed clock signal from the programmable delay line to a second input of the programmable phase comparator;

g) connecting a first output from the programmable phase comparator to an input of the first counter;

h) connecting a second output from the programmable phase comparator to an input of the second counter;

i) programming the programmable delay line to produce the delayed clock signal such that the delayed clock signal is one clock cycle delayed from the clock signal;

j) programming the programmable phase comparator to measure the time difference between the period of the clock signal and the period of the delayed clock signal;

k) programming a dead zone for the programmable phase comparator;

l) such that if the time difference between the period of the clock signal and the period of the delayed clock signal is greater than the dead zone, the first counter is triggered;

m) such that if the time difference between the period of the clock signal and the period of the delayed clock signal is negative and the absolute value is greater than the dead zone, the second counter is triggered;

n) wherein the values in the first and second counters are used to determine a statistical distribution;

o) wherein the statistical distribution is used to determine on-chip, cycle-to-cycle jitter.

12. A method as in claim 11 wherein measurements are made at more than one location on a clock distribution.

13. A method as in claim 11 wherein the statistical distribution is gaussian.

14. A method as in claim 11 wherein the programmable delay line comprises:

a) an inverter chain with an input and output;

b) a multiplexer with multiple inputs, control inputs, and an output;

c) wherein each input of the multiple inputs of the multiplexer is connected to a separate individual node of the inverter chain;

d) wherein the input of the inverter chain is the input of the programmable delay line;

e) wherein the output of the multiplexer is the output of the programmable delay line;

f) such that the delay of the programmable delay line may be varied by selecting one of the multiple inputs of the multiplexer using the control inputs of the multiplexer.

15. A method as in claim 11 wherein the programmable delay line comprises:

a) a first inverter chain with an input and output;

b) a second inverter chain with an input and output;

c) a first multiplexer with multiple inputs, control inputs, and an output;

d) a second multiplexer with multiple inputs, control inputs, and an output;

e) wherein each input of the multiple inputs of the first multiplexer is connected to a separate individual node of the first inverter chain;

f) wherein each input of the multiple inputs of the second multiplexer is connected to a separate individual node of the second inverter chain;

g) wherein the input of the first inverter chain is the input of the programmable delay line;

h) wherein the output of the second multiplexer is the output of the programmable delay line;

i) wherein the output of the first multiplexer is connected to the input of the second inverter chain;

j) such that the delay of the programmable delay line may be varied by selecting one of the multiple inputs of the first multiplexer and second multiplexer using the control inputs of the first multiplexer and second multiplexer.

16. A method as in claim 1 wherein the time delay through any individual inverter in the first inverter chain is shorter than the time delay through any individual inverter in the second inverter chain.

17. A method as in claim 1 wherein the time delay through any individual inverter in the first inverter chain is longer than the time delay through any individual inverter in the second inverter chain.

18. A method as in claim 1 wherein the programmable delay line comprises:

a) a first inverter chain with an input and output;

b) a second inverter chain with an input and output;

c) a first multiplexer with multiple inputs, control inputs, and an output;

d) a second multiplexer with multiple inputs, control inputs, and an output;

e) a set of NFETs;

f) a set of capacitors;

g) a set of control signals;

h) wherein each input of the multiple inputs of the first multiplexer is connected to a separate individual node of the first inverter chain;

i) wherein each input of the multiple inputs of the second multiplexer is connected to a separate individual node of the second inverter chain;

j) wherein the input of the first inverter chain is the input of the programmable delay line;

k) wherein the output of the second multiplexer is the output of the programmable delay line;

l) wherein the output of the first multiplexer is connected to the input of the second inverter chain;

m) wherein the drain of each NFET in the set of NFETs is connected to the output of the programmable delay line;

n) where in the gate of each NFET in the set of NETs is connected to an individual control signal in the set of control signals;

o) where in the source of each NFET in the set of NETs is connected to an individual first connection of each capacitor in the set of capacitors;

p) where in each second connection to each capacitor in the set of capacitors is connected to ground;

q) such that the delay of the programmable delay line may be fine tuned by selecting one of the multiple inputs of the first multiplexer using the control inputs of the first multiplexer and;

r) the delay of the programmable delay line may be fine tuned by selecting one of the multiple inputs of the second multiplexer using the control inputs of the second multiplexer and;

s) the delay of the programmable delay line may be fine tuned by selecting an appropriate number of capacitors from the set of capacitors using an appropriate combination of the control signals from the set of control signals connected to the set of NFETs.

19. A method as in claim 11 wherein the time difference between the period of the clock signal and the period of the delayed clock signal is measured from the positive-going zero-crossing of the clock signal to the positive-going zero-crossing of the delayed clock signal.

* * * * *

UNITED STATES PATENT AND TRADEMARK OFFICE
CERTIFICATE OF CORRECTION

PATENT NO. : 6,841,985 B1  Page 1 of 1
APPLICATION NO. : 10/630175
DATED : January 11, 2005
INVENTOR(S) : Eric S. Fetzer It is certified that error appears in the above-identified patent and that said Letters Patent is hereby corrected as shown below:

IN THE SPECIFICATION

Column 4, line 57, delete "ips" and insert therefor --1ps--

IN THE CLAIMS

Claim 6, Column 6, line 60, delete "where in" and insert therefor --wherein--

Claim 6, Column 6, line 63, delete "where in" and insert therefor --wherein--

Claim 6, Column 6, line 66, delete "where in" and insert therefor --wherein--

Claim 18, Column 9, line 20, delete "where in" and insert therefor --wherein--

Claim 18, Column 9, line 23, delete "where in" and insert therefor --wherein--

Claim 18, Column 10, line 1, delete "where in" and insert therefor --wherein--

Signed and Sealed this

Twenty-sixth Day of June, 2007

JON W. DUDAS
*Director of the United States Patent and Trademark Office*